(12) United States Patent
Soenen et al.

(10) Patent No.: US 12,253,563 B2
(45) Date of Patent: Mar. 18, 2025

(54) DEVICE AND METHOD FOR MEASURING A DUTY CYCLE OF A CLOCK SIGNAL

(71) Applicant: Taiwan Semiconductor Manufacturing Company, Ltd., Hsinchu (TW)

(72) Inventors: Eric Soenen, Austin, TX (US); Alan Roth, Leander, TX (US)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 214 days.

(21) Appl. No.: 17/828,135

(22) Filed: May 31, 2022

(65) Prior Publication Data
US 2023/0408580 A1  Dec. 21, 2023

(51) Int. Cl.
*G01R 31/317* (2006.01)
*H02M 3/07* (2006.01)
*H03K 3/017* (2006.01)

(52) U.S. Cl.
CPC ........ *G01R 31/31727* (2013.01); *H02M 3/07* (2013.01); *H03K 3/017* (2013.01)

(58) Field of Classification Search
CPC .... G01R 31/31727; H03K 3/017; H02M 3/07
USPC ............ 714/731; 324/615; 713/500–503
See application file for complete search history.

(56) References Cited

U.S. PATENT DOCUMENTS

| | | | |
|---|---|---|---|
| 8,089,289 B1 * | 1/2012 | Kremin | H03K 17/955 324/678 |
| 8,644,440 B1 | 2/2014 | Ding | |
| 10,389,112 B2 * | 8/2019 | Chien | H02M 3/158 |
| 10,425,092 B2 | 9/2019 | Shu et al. | |
| 11,652,489 B1 * | 5/2023 | Fortier | H03K 3/017 327/156 |
| 2009/0112555 A1 * | 4/2009 | Boerstler | G01R 31/31727 703/14 |
| 2012/0119788 A1 | 5/2012 | Turner et al. | |
| 2017/0111036 A1 | 4/2017 | Seo et al. | |

(Continued)

FOREIGN PATENT DOCUMENTS

| | | | |
|---|---|---|---|
| TW | I337004 | 2/2011 | |
| TW | 201532389 | 8/2015 | |
| WO | WO-2023114927 A1 * | 6/2023 | H02M 1/0009 |

OTHER PUBLICATIONS

Taiwan office action; application No. 112100734; dated Dec. 19, 2023.

*Primary Examiner* — Paresh Patel
*Assistant Examiner* — Rahul Maini
(74) *Attorney, Agent, or Firm* — Jones Day

(57) ABSTRACT

A duty cycle measurement (DCM) device includes a charge pump circuit and a clocked comparator circuit. The charge pump circuit is configured to receive a clock signal that has an unknown duty cycle and to generate a capacitor voltage based on the duty cycle of the clock signal. The clocked comparator circuit is configured to receive the capacitor voltage and a reference voltage and to generate a digital output code based on the capacitor voltage and the reference voltage. The digital output code is indicative of the duty cycle of the clock signal. The charge pump circuit is further configured to receive the digital output code. A method of determining a duty cycle of a clock signal is also disclosed.

20 Claims, 5 Drawing Sheets

(56) References Cited

U.S. PATENT DOCUMENTS

2017/0117887 A1  4/2017 Lee et al.
2023/0368847 A1* 11/2023 Yabe ..................... H02M 3/07

* cited by examiner

DEVICE AND METHOD FOR MEASURING A DUTY CYCLE OF A CLOCK SIGNAL

BACKGROUND

Digital circuits use a clock signal to sequence operations thereof. In certain applications, it is desirable to generate a clock signal that has a particular duty cycle, such as a 50% duty cycle. Duty cycle refers to the percentage of time a clock signal is on compared to the period of one cycle. Thus, a 50% duty cycle means the clock signal is on 50% of the time and off 50% of the time.

BRIEF DESCRIPTION OF THE DRAWINGS

Aspects of the present disclosure are best understood from the following detailed description when read with the accompanying figures.

DETAILED DESCRIPTION

Figure 1:
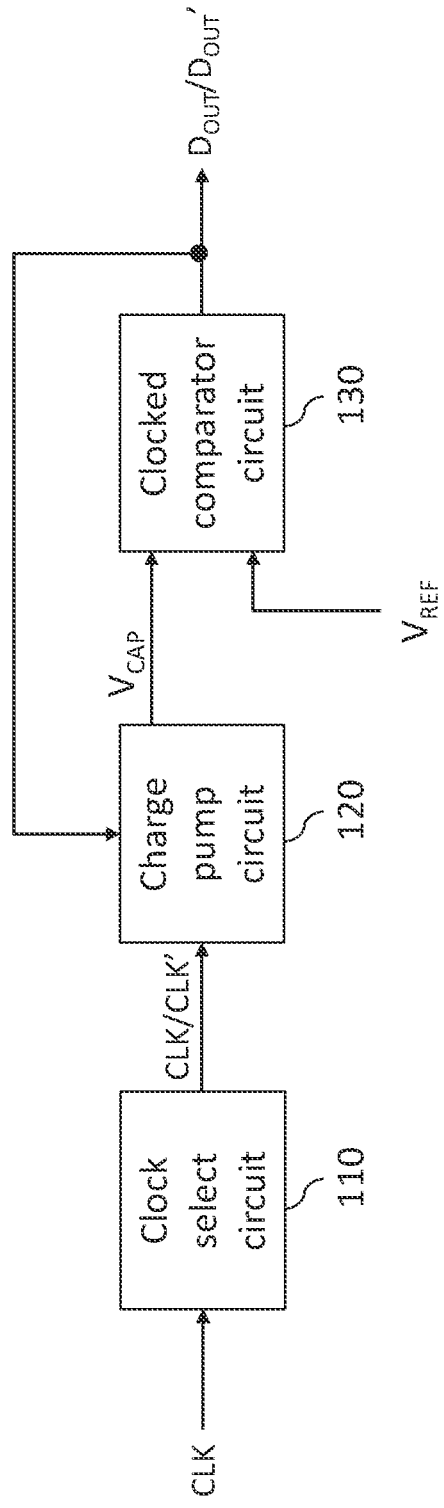
FIG. 1 is a schematic block diagram illustrating an exemplary duty cycle measurement (DCM) device in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Operating duty cycles of a circuit can drift over time, such that the circuit may not always operated according to specification. For example, a duty cycle of a circuit may tend to deviate from 50% after a clock signal passes through several components and/or due to changes in the operating conditions, such as voltage and temperature. In order to adjust the clock signal back to its proper duty cycle, a system may seek to measure accurately the duty cycle of the clock signal.

Systems and methods, in certain embodiments, as described herein measure a duty cycle of a clock signal using a first-order delta-sigma analog-to-digital converter, whereby the duty cycle of the clock signal may be measured with relatively high accuracy. In further detail, FIG. 1 is a schematic block diagram illustrating an exemplary duty cycle measurement (DCM) device 100 in accordance with various embodiments of the present disclosure. In this exemplary embodiment, the DCM device 100 is operable in a measurement mode and a calibration mode. In the measurement mode, the DCM device 100 is configured to receive a clock signal (CLK) that has an unknown duty cycle and to generate a digital output code ($D_{OUT}$) indicative of the duty cycle of the clock signal (CLK).

In the calibration mode, the DCM device 100 is configured to receive a clock signal (CLK') that has a predetermined duty cycle, e.g., about 50%, and to generate a digital output code ($D_{OUT}'$) indicative of the duty cycle of the clock signal (CLK'). The digital output code ($D_{OUT}$) obtained during the measurement mode may be compared with the digital output code ($D_{OUT}'$) obtained during the calibration mode to determine whether or not the clock signal (CLK) has a duty cycle of about 50%.

As illustrated in FIG. 1, the DCM device 100 includes a clock select circuit 110, a charge pump circuit 120, and a clocked comparator circuit 130. The clock select circuit 110 is configured to receive a clock signal (CLK) that has an unknown duty cycle, e.g., from a clock generator included in or external to the DCM device 100. The clock select circuit 110 is further configured to generate a clock signal (CLK') that has a predetermined duty cycle, e.g., about 50%, based on the clock signal (CLK). The clock select circuit 110 is further configured to provide at an output thereof either the clock signal (CLK), i.e., when the DCM device 100 is in the measurement mode, or the clock signal (CLK'), i.e., when the DCM device 100 is in the calibration mode.

The charge pump circuit 120 is connected to the output of the clock select circuit 110 so as to receive the clock signal (CLK/CLK'). The charge pump circuit 120 is further configured to charge and discharge a capacitor thereof, e.g., capacitor (C) in FIG. 2, based on the duty cycle of the clock signal (CLK/CLK'), whereby the charge pump circuit 120 generates a capacitor voltage ($V_{CAP}$) at an output thereof.

The clocked comparator circuit 130 is connected to the output of the charge pump circuit 120 so as to receive the capacitor voltage ($V_{CAP}$). The clocked comparator circuit 130 is further configured to receive a reference voltage ($V_{REF}$), e.g., from a voltage generator included in or external to the DCM device 100. The clocked comparator circuit 130 is further configured to compare the capacitor voltage ($V_{CAP}$) with the reference voltage ($V_{REF}$), whereby the clocked comparator circuit 130 generates a digital output code ($D_{OUT}/D_{OUT}'$) at an output thereof. The digital output code ($D_{OUT}/D_{OUT}'$) is indicative of the duty cycle of the clock signal (CLK/CLK'). The charge pump circuit 120 is further connected to the output of the clocked comparator circuit 130 so as to receive the digital output code ($D_{OUT}/D_{OUT}'$). As will be described hereinafter, the charge pump circuit 120 and the clocked comparator circuit 130 constitute a first-order delta-sigma analog-to-digital converter.

Figure 2:
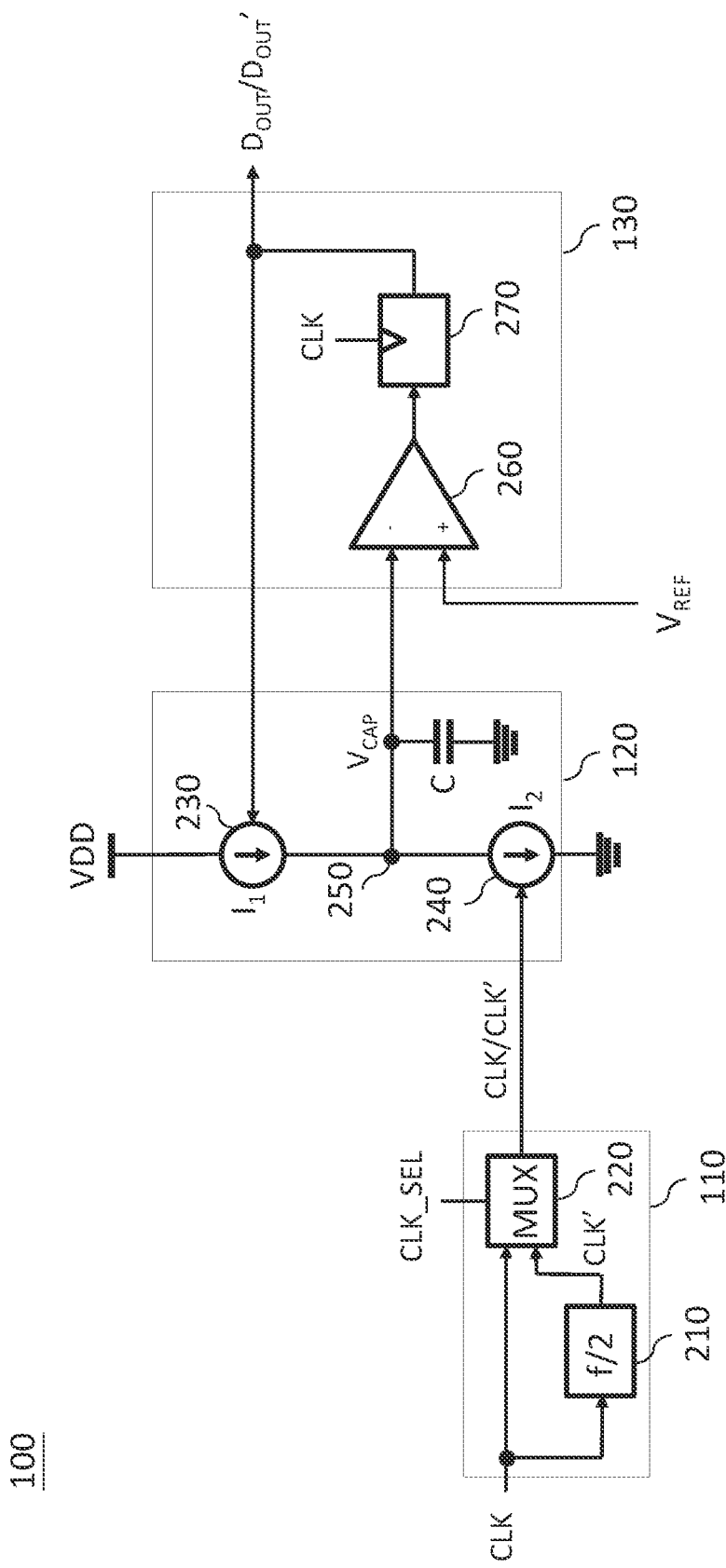
FIG. 2 is a schematic circuit diagram illustrating an exemplary clock select circuit, an exemplary charge pump circuit, and an exemplary clocked comparator circuit of a DCM device in accordance with various embodiments of the present disclosure.

FIG. 2 is a schematic circuit diagram illustrating an exemplary clock select circuit 110, an exemplary charge pump circuit 120, and an exemplary clocked comparator circuit 130 of the DCM device 100 in accordance with various embodiments of the present disclosure. As illustrated in FIG. 2, the clock select circuit 110 includes a frequency divider 210 and a multiplexer 220. The frequency divider 210 and the multiplexer 220 are configured to receive the clock signal (CLK), which has an unknown duty cycle. The frequency divider 210 is further configured to divide a frequency of the clock signal (CLK) by two so as to provide the clock signal (CLK'), which has a duty cycle of about 50%, at an output thereof. The multiplexer 220 is connected to the output of the frequency divider 210 so as to receive the clock signal (CLK'). The multiplexer 220 is further configured to receive a clock select signal (CLK_SEL), e.g., from a signal generator included in or external to the DCM device 100. The clock select signal (CLK_SEL) may be asserted/de-asserted so that the multiplexer 220 provides the clock signal (CLK/CLK') at an output thereof.

The charge pump circuit 120 includes a first current source 230, a second current source 240, and a capacitor (C). The first current source 230 has a first current source terminal configured to receive a supply voltage (VDD), e.g., from a voltage generator included in or external to the DCM device 100, and a second current source terminal connected to a capacitor voltage node 250.

The second current source 240 has a first current source terminal connected to the capacitor voltage node 250, a second current source terminal connected to the electrical ground, and a third current source terminal that is connected to the output of the multiplexer 220 and that receives the clock signal (CLK/CLK'). The capacitor (C) is connected between the capacitor voltage node 250 and the electrical ground. The first current source 230 is configured to source a current ($I_1$) through the capacitor voltage node 250, thereby charging the capacitor (C). The second current source 240 is configured to sink a current ($I_2$) through the capacitor voltage node 250, thereby discharging the capacitor (C). The charging and discharging of the capacitor (C) result in a capacitor voltage ($V_{CAP}$) at the capacitor voltage node 250.

The clocked comparator circuit 130 includes a comparator 260 and a latch 270. The comparator 260 has an inverting terminal connected to the capacitor voltage node 250 and configured to receive the capacitor voltage ($V_{CAP}$) and a non-inverting terminal configured to receive the reference voltage ($V_{REF}$). The latch 250 has a first latch terminal connected to an output terminal of the comparator 260, a second latch terminal configured to receive the clock signal (CLK), and a third latch terminal that provides the digital output code ($D_{OUT}/D_{OUT}'$). The first current source 230 further has a third current source terminal connected to the third latch terminal of the latch 270 so as to receive the digital output code ($D_{OUT}/D_{OUT}'$). The comparator 260 is configured to compare the capacitor voltage ($V_{CAP}$) with the reference voltage ($V_{REF}$) and to generate the digital output code ($D_{OUT}/D_{OUT}'$) based on the result of the comparison. The latch 270 provides the digital output code ($D_{OUT}/D_{OUT}'$) as an output at a rising/falling edge of the clock signal (CLK).

As will be described hereinafter, the DCM device 100 operate first in the calibration mode to obtain the digital output code ($D_{OUT}'$) and then in the measurement mode to obtain the digital output code ($D_{OUT}$), whereby the digital output code ($D_{OUT}$) may be compared with the digital output code ($D_{OUT}'$) so as to determine whether or not the clock signal (CLK) has a duty cycle of about 50%. During the calibration mode, the clock select circuit 110 receives the clock signal (CLK), which has an unknown clock cycle, and divides a frequency of the clock signal (CLK) by two, thereby obtaining the clock signal (CLK'), which has a duty cycle of about 50%. The clock select signal (CLK_SEL) is asserted and the clock select circuit 110 provides the clock signal (CLK') at the output thereof. When the clock signal (CLK') transitions from a low logic state to a high logic state, the second current source 240 is turned on. The second current source 240 then sinks a current ($I_2$) through the capacitor voltage node 250. The current ($I_2$), in turn, discharges the capacitor (C). When a capacitor voltage ($V_{CAP}$) at the capacitor voltage node 250 decreases to less than the reference voltage ($V_{REF}$), i.e., the clocked comparator circuit 130 detects that the reference voltage ($V_{REF}$) is greater than the capacitor voltage ($V_{CAP}$), the clocked comparator circuit 130 outputs a high logic state, turning on the first current source 230. The first current source 230 then sources a current ($I_1$) through the capacitor voltage node 250. The current ($I_1$), in turn, charges the capacitor (C). When the capacitor voltage ($V_{CAP}$) increases to greater than the reference voltage ($V_{REF}$), i.e., the clocked comparator circuit 130 detects that the reference voltage ($V_{REF}$) is less than the capacitor voltage ($V_{CAP}$), the clocked comparator circuit 130 outputs a low logic state, turning off the first current source 230. The clock signal (CLK') then again transitions from a low logic state to a high logic state and the procedure is repeated. When a steady state is reached, the first current source 230 sources a current ($I_1$) to the capacitor (C) as much as the second current source 240 sinks a current ($I_2$) from the capacitor (C), the capacitor voltage ($V_{CAP}$) is substantially equal to the reference voltage ($V_{REF}$), and the digital output code ($D_{OUT}'$) corresponds to the duty cycle, i.e., about 50%, of the clock signal (CLK').

Thereafter, the DCM device 100 enters the measurement mode. During the measurement mode, the clock select signal (CLK_SEL) is de-asserted and the clock select circuit 110 provides the clock signal (CLK) at the output thereof. When the clock signal (CLK) transitions from a low logic state to a high logic state, the second current source 240 is turned on. The second current source 240 then sinks a current ($I_2$) through the capacitor voltage node 250. The current ($I_2$), in turn, discharges the capacitor (C). When a capacitor voltage ($V_{CAP}$) at the capacitor voltage node 250 decreases to less than the reference voltage ($V_{REF}$), i.e., the clocked comparator circuit 130 detects that the reference voltage ($V_{REF}$) is greater than the capacitor voltage ($V_{CAP}$), the clocked comparator circuit 130 outputs a high logic state, turning on the first current source 230. The first current source 230 then sources a current ($I_1$) through the capacitor voltage node 250. The current ($I_1$), in turn, charges the capacitor (C). When the capacitor voltage ($V_{CAP}$) increases to greater than the reference voltage ($V_{REF}$), i.e., the clocked comparator circuit 130 detects that the reference voltage ($V_{REF}$) is less than the capacitor voltage ($V_{CAP}$), the clocked comparator circuit 130 outputs a low logic state, turning off the first current source 230. The clock signal (CLK) then again transitions from a low logic state to a high logic state and the procedure is repeated. When a steady state is reached, the first current source 230 sources a current ($I_1$) to the capacitor (C) as much as the second current source 240 sinks a current ($I_2$) from the capacitor (C), the capacitor voltage ($V_{CAP}$) is substantially equal to the reference voltage ($V_{REF}$), and the digital output code ($D_{OUT}$) corresponds to the duty cycle of the clock signal (CLK).

Figure 3:
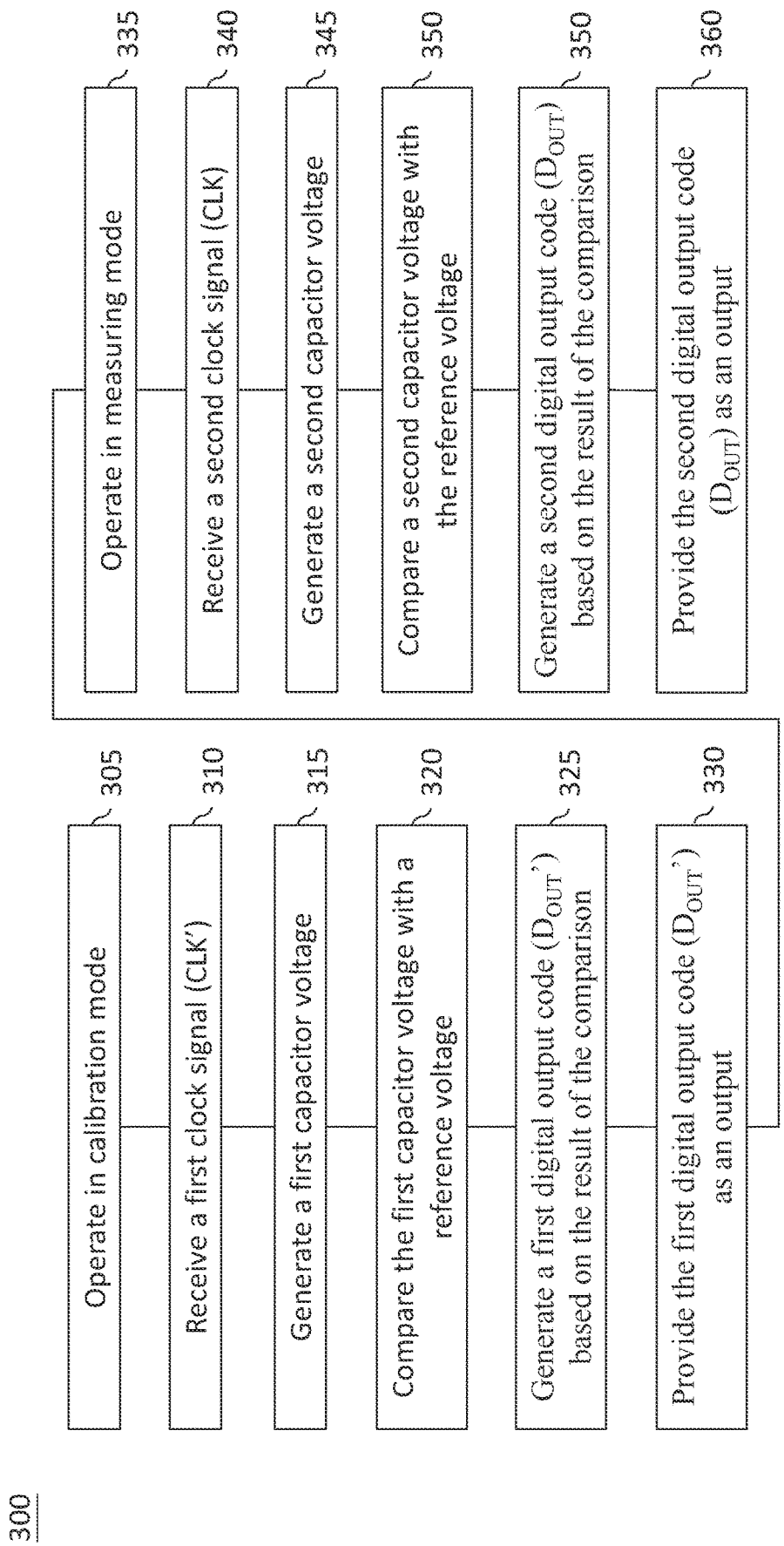
FIG. 3 is a flow chart illustrating an exemplary method of measuring a duty cycle of a clock signal in accordance with various embodiments of the present disclosure.

FIG. 3 is a flow chart illustrating an exemplary method 300 of measuring a duty cycle of a clock signal (CLK) in accordance with various embodiments of the present disclosure. Method 300 will now be described with further reference to FIG. 2 for ease of understanding. It is understood that method 300 is applicable to structures other than those of FIG. 2. Further, it is understood that additional operations can be provided before, during, and after method 300, and some of the operations described below can be replaced or eliminated, in an alternative embodiment of method 300.

In operation 305, the DCM device 100 operates in a calibration mode. That is, the clock select circuit 110 receives a clock signal (CLK) that has an unknown duty cycle and divides the frequency of the clock signal (CLK) by two, thereby obtaining a clock signal (CLK') that has a duty cycle of about 50%. The DCM device 100 asserts the clock select signal (CLK_SEL) and the clock select circuit 110 provides the clock signal (CLK') at the output thereof.

In operation 310, the second current source 240 receives the clock signal (CLK') from the clock select circuit 110.

In operation 315, a capacitor voltage ($V_{CAP}$) is generated at the capacitor voltage node 250. For example, the clock signal (CLK') transitions from a low logic state to a high logic state. The second current source 240 is turned on and sinks a current ($I_2$) through the capacitor voltage node 250, thereby discharging the capacitor (C). Thereafter, the first current source 230 receives a digital output code ($D_{OUT}'$) that has a high logic state. The first current source 230 is turned on and sources a current ($I_1$) through the capacitor voltage node 250, thereby charging the capacitor (C). The charging and discharging of the capacitor (C) result in the capacitor voltage ($V_{CAP}$) at the capacitor voltage node 250.

In operation 320, the clocked comparator circuit 130 compares the capacitor voltage ($V_{CAP}$) with a reference voltage ($V_{REF}$).

In operation 325, the clocked comparator circuit 130 generates a digital output code ($D_{OUT}'$) based on the result of the comparison. For example, when the clocked comparator circuit 130 detects that the reference voltage ($V_{REF}$) is greater than the capacitor voltage ($V_{CAP}$), the clocked comparator circuit 130 generates a high logic state, otherwise, i.e., the clocked comparator circuit 130 detects that the reference voltage ($V_{REF}$) is less than the capacitor voltage ($V_{CAP}$), the clocked comparator circuit 130 generates a low logic state.

In operation 330, the clocked comparator circuit 130 provides the digital output code ($D_{OUT}'$) at the output thereof as a rising/falling edge of the clock signal (CLK).

In operation 335, the DCM device 100 operates in a measurement mode. That is, the DCM device 100 de-asserts the clock select signal (CLK_SEL) and the clock select circuit 110 provides the clock signal (CLK) at the output thereof.

In operation 340, the second current source 240 receives the clock signal (CLK) from the clock select circuit 110.

In operation 345, a capacitor voltage ($V_{CAP}$) is generated at the capacitor voltage node 250. For example, the second current source 240 receives a clock signal (CLK) that transitions from a low logic state to a high logic state. The second current source 240 is turned on and sinks a current ($I_2$) through the capacitor voltage node 250, thereby discharging the capacitor (C). Thereafter, the first current source 230 receives a digital output code ($D_{OUT}$) that has a high logic state. The first current source 230 is turned on and sources a current ($I_1$) through the capacitor voltage node 250, thereby charging the capacitor (C). The charging and discharging of the capacitor (C) result in the capacitor voltage ($V_{CAP}$) at the capacitor voltage node 250.

In operation 350, the clocked comparator circuit 130 compares the capacitor voltage ($V_{CAP}$) with the reference voltage ($V_{REF}$).

In operation 355, the clocked comparator circuit 130 generates a digital output code ($D_{OUT}$) based on the result of the comparison. For example, when the clocked comparator circuit 130 detects that the reference voltage ($V_{REF}$) is greater than the capacitor voltage ($V_{CAP}$), the clocked comparator circuit 130 generates a high logic state, i.e., the clocked comparator circuit 130 detects that the reference voltage ($V_{REF}$) is less than the capacitor voltage ($V_{CAP}$), the clocked comparator circuit 130 generates a low logic state.

In operation 360, the clocked comparator circuit 130 provides the digital output code ($D_{OUT}$) at the output thereof at a rising/falling edge of the clock signal (CLK).

Figure 4:
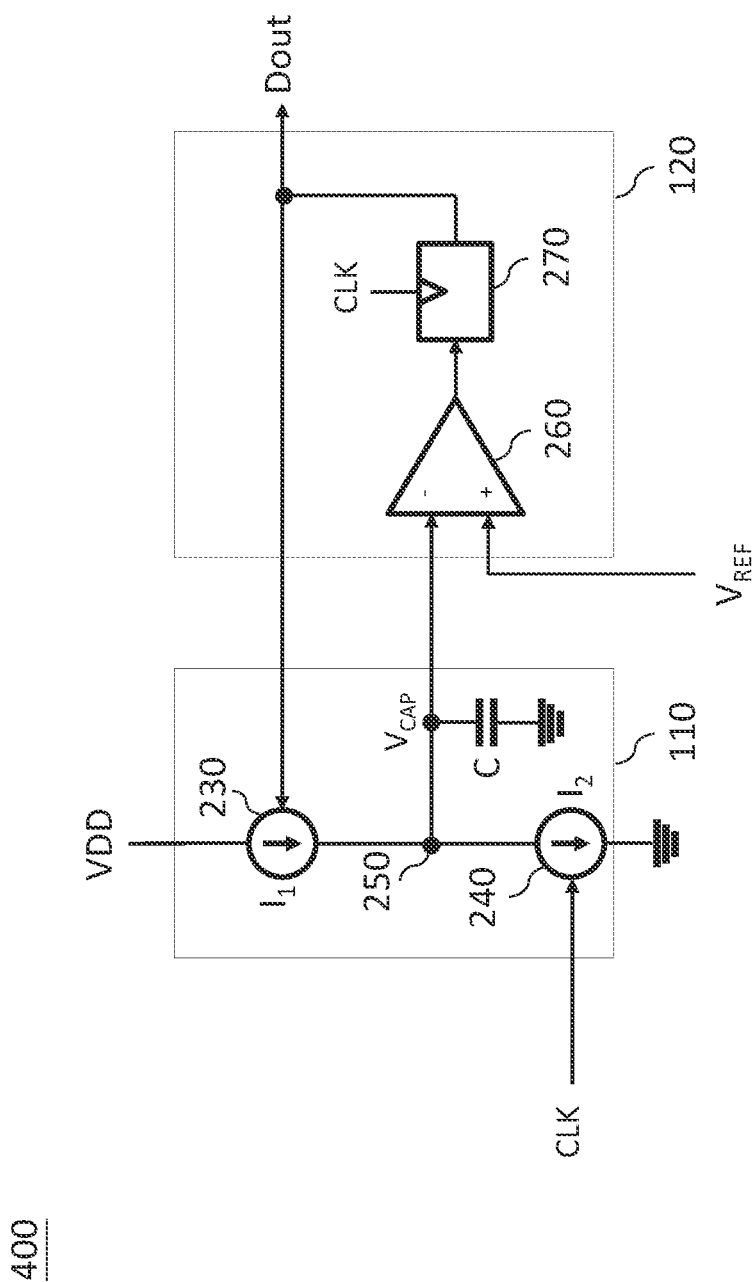
FIG. 4 is a schematic circuit diagram illustrating another exemplary DCM device in accordance with various embodiments of the present disclosure.

FIG. 4 is a schematic diagram illustrating another exemplary DCM device 400 in accordance with various embodiments of the present disclosure. The DCM device 400 of this embodiment differs from the DCM device 100 in that the DCM device 400 is operable only in the measurement mode. That is, as illustrated in FIG. 1, the DCM device 400 is dispensed with the clock select circuit 110. Because the construction and operation of the DCM device 400 are similar to those described hereinabove in connection with the DCM device 100, a detailed description of the same will be dispensed with herein for the sake of brevity.

Figure 5:
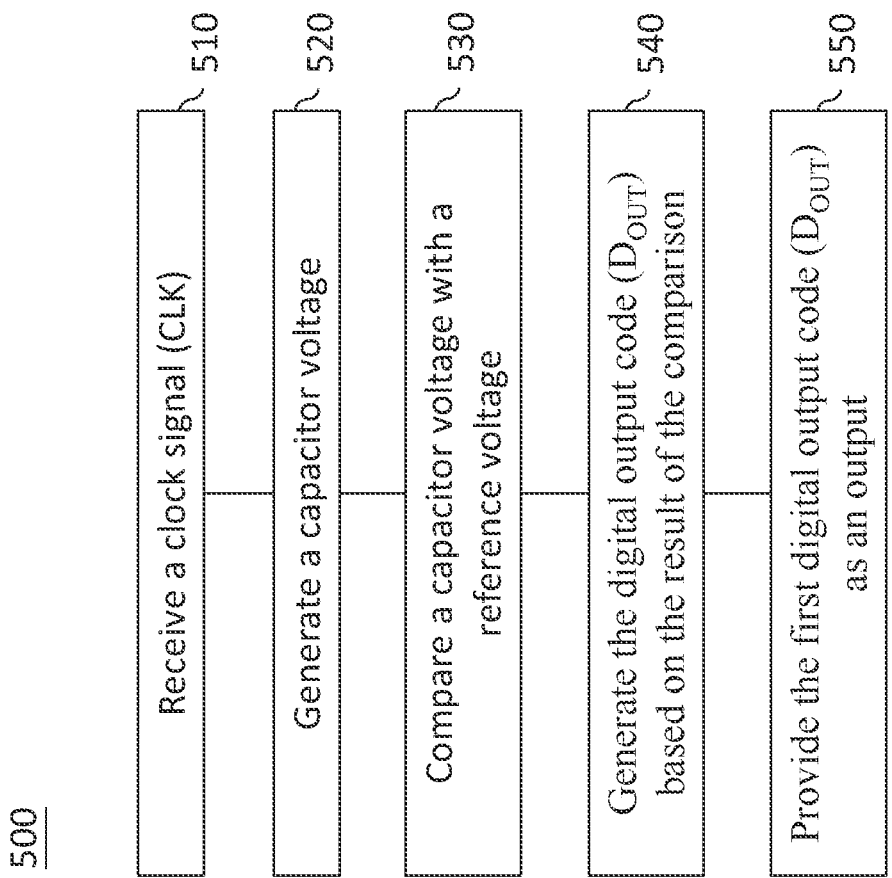
FIG. 5 is a flow chart illustrating another exemplary method of measuring a duty cycle of a clock signal in accordance with various embodiments of the present disclosure.

FIG. 5 is a flow chart illustrating another exemplary method 500 of measuring a duty cycle of a clock signal in accordance with various embodiments of the present disclosure. Method 500 will now be described with further reference to FIG. 4 for ease of understanding. It is understood that method 500 is applicable to structures other than those of FIG. 4. Further, it is understood that additional operations can be provided before, during, and after method 500, and some of the operations described below can be replaced or eliminated, in an alternative embodiment of method 500.

In operation 510, the second current source 240 receives the clock signal (CLK).

In operation 520, a capacitor voltage ($V_{CAP}$) is generated at the capacitor voltage node 250. For example, the second current source 240 receives a clock signal (CLK) that transitions from a low logic state to a high logic state. The second current source 240 is turned on and sinks a current ($I_2$) through the capacitor voltage node 250, thereby discharging the capacitor (C). Thereafter, the first current source 230 receives a digital output code ($D_{OUT}$) that has a high logic state. The first current source 230 is turned on and sources a current ($I_1$) through the capacitor voltage node 250, thereby charging the capacitor (C). The charging and discharging of the capacitor (C) result in the capacitor voltage ($V_{CAP}$) at the capacitor voltage node 250.

In operation 530, the clocked comparator circuit 130 compares the capacitor voltage ($V_{CAP}$) with the reference voltage ($V_{REF}$).

In operation 540, the clocked comparator circuit 130 generates a digital output code ($D_{OUT}$) based on the result of the comparison. For example, when the clocked comparator circuit 130 detects that the reference voltage ($V_{REF}$) is greater than the capacitor voltage ($V_{CAP}$), the clocked comparator circuit 130 generates a high logic state, otherwise, i.e., the clocked comparator circuit 130 detects that the reference voltage ($V_{REF}$) is less than the capacitor voltage ($V_{CAP}$), the clocked comparator circuit 130 generates a low logic state.

In operation 550, the clocked comparator circuit 130 provides the digital output code ($D_{OUT}$) at the output thereof at a rising/falling edge of the clock signal (CLK).

In an embodiment, a duty cycle measurement (DCM) device comprises a charge pump circuit and a clocked comparator circuit. The charge pump circuit is configured to receive a clock signal that has an unknown duty cycle and to generate a capacitor voltage based on the duty cycle of the clock signal. The clocked comparator circuit is configured to receive the capacitor voltage and a reference voltage and to generate a digital output code based on the capacitor voltage and the reference voltage. The digital output code is indicative of the duty cycle of the clock signal. The charge pump circuit is further configured to receive the digital output code.

In another embodiment, a duty cycle measurement (DCM) device comprises a clock select circuit, a charge pump circuit, and a clocked comparator circuit. The clock select circuit is configured to provide a clock signal that has predetermined duty cycle. The charge pump circuit is configured to receive the clock signal and to generate a capacitor voltage based on a duty cycle of the clock signal. The clocked comparator circuit is configured to receive the capacitor voltage and a reference voltage and to generate a digital output code based on the capacitor voltage and the reference voltage. The digital output code is indicative of the duty cycle of the clock signal. The charge pump circuit is further configured to receive the digital output code.

In another embodiment, a method of determining a duty cycle of a clock signal includes steps of operating in a calibration mode; receiving a clock signal that has a predetermined duty cycle; generating a capacitor voltage based on the duty cycle of the clock signal; comparing the capacitor voltage with a reference voltage; generating a digital output code based on the result of the comparison; and receiving the digital output code.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A duty cycle measurement (DCM) device comprising:
a charge pump circuit configured to receive a clock signal that has an unknown duty cycle and to generate a capacitor voltage based on the duty cycle of the clock signal, wherein the charge pump circuit comprises at least one current source having a first current source terminal connected to a capacitor voltage node, a second current source terminal connected to an electrical ground, and a third current source terminal configured to receive the clock signal; and
a clocked comparator circuit configured to receive the capacitor voltage and a reference voltage and to generate a digital output code based on the capacitor voltage and the reference voltage, wherein the digital output code is indicative that the duty cycle of the clock signal is about 50%, wherein the charge pump circuit is further configured to receive the digital output code.

2. The DCM device of claim 1, wherein the charge pump circuit includes:
a first current source having a first current source terminal configured to receive a supply voltage, a second current source terminal connected to the capacitor voltage node, and a third current source terminal configured to receive the digital output code;
a second current source having a first current source terminal connected to the capacitor voltage node, a second current source terminal connected to the electrical ground, and a third current source terminal configured to receive the clock signal; and
a capacitor connected between the capacitor voltage node and the electrical ground.

3. The DCM device of claim 2, wherein the clocked comparator circuit includes a comparator having an inverting terminal connected to the capacitor voltage node and a non-inverting terminal configured to receive the reference voltage.

4. The DCM device of claim 3, wherein the clocked comparator circuit further includes a latch having a first latch terminal connected to the comparator and a second latch terminal connected to the third current source terminal of the first current source.

5. The DCM device of claim 4, wherein the latch further includes a third latch terminal configured to receive the clock signal.

6. A duty cycle measurement (DCM) device comprising:
a clock select circuit configured to provide a first clock signal that has predetermined duty cycle;
a charge pump circuit configured to receive the first clock signal and to generate a capacitor voltage based on a duty cycle of the first clock signal, wherein the charge pump circuit comprises at least one current source having a first current source terminal connected to a capacitor voltage node, a second current source terminal connected to an electrical ground, and a third current source terminal configured to receive the first clock signal; and
a clocked comparator circuit configured to receive the capacitor voltage and a reference voltage and to generate a digital output code based on the capacitor voltage and the reference voltage, wherein the digital output code is indicative that the duty cycle of the first clock signal is about 50%, wherein the charge pump circuit is further configured to receive the digital output code.

7. The DCM device of claim 6, wherein the charge pump circuit includes:
a first current source having a first current source terminal configured to receive a supply voltage, a second current source terminal connected to the capacitor voltage node, and a third current source terminal configured to receive the digital output code;
a second current source having a first current source terminal connected to the capacitor voltage node, a second current source terminal connected to the electrical ground, and a third current source terminal configured to receive the first clock signal; and
a capacitor connected between the capacitor voltage node and the electrical ground.

8. The DCM device of claim 7, wherein the clocked comparator circuit includes a comparator having an inverting terminal connected to the capacitor voltage node and a non-inverting terminal configured to receive the reference voltage.

9. The DCM device of claim 8, wherein the clocked comparator circuit further includes a latch having a first latch terminal connected to an output of the comparator and a second latch terminal connected to the third current source terminal of the first current source.

10. The DCM device of claim 9, wherein the latch further includes a third latch terminal configured to receive the first clock signal.

11. The DCM device of claim 6, wherein the clock select circuit is further configured to receive a second clock signal that has an unknown duty cycle and a clock select signal and to provide at the output thereof one of the first and second clock signals based on the clock select signal.

12. The DCM device of claim 6, wherein the clock select circuit includes a frequency divider configured to receive a second clock signal and to divide a frequency of the second clock signal to obtain the first clock signal.

13. The DCM device of claim 12, wherein the clock select circuit further includes a multiplexer configured to receive the first and second clock signals.

14. A method of determining a duty cycle of a clock signal, the method comprising:
   operating in a calibration mode;
   receiving, by a source current, a first clock signal that has a predetermined duty cycle, wherein the current source has a first current source terminal connected to a capacitor voltage node, a second current source terminal connected to an electrical ground, and a third current source terminal configured to receive the first clock signal;
   generating a first capacitor voltage based on the duty cycle of the first clock signal;
   comparing the first capacitor voltage with a reference voltage;
   generating a first digital output code based on the result of the comparison and indicative that the duty cycle of the first clock signal is about 50%; and
   receiving the first digital output code.

15. The method of claim 14, wherein operating in the calibration mode includes:
   receiving a second clock signal;
   dividing a frequency of the second clock signal to obtain the first clock signal;
   receiving a clock select signal; and
   providing the first clock signal as an output based on the clock select signal.

16. The method of claim 14, wherein generating the first capacitor voltage includes charging and discharging a capacitor based on the duty cycle of the first clock signal.

17. The method of claim 14, further comprising:
   operating in a measurement mode;
   receiving a second clock signal that has an unknown duty cycle;
   generating a second capacitor voltage based on the duty cycle of the second clock signal;
   comparing the second capacitor voltage with the reference voltage;
   generating the second digital output code based on the result of the comparison; and
   receiving the second digital output code.

18. The method of claim 17, wherein operating in the measurement mode includes:
   receiving a second clock signal;
   dividing a frequency of the second clock signal to obtain the first clock signal;
   receiving a clock select signal; and
   providing the second clock signal as an output based on the clock select signal.

19. The method of claim 17, wherein generating the second capacitor voltage includes charging and discharging a capacitor based on the duty cycle of the second clock signal.

20. The method of claim 17, further comprising:
   providing the first digital output code as an output; and
   providing the second digital output code as an output.

* * * * *